United States Patent [19]
Okada et al.

[11] 4,101,841
[45] Jul. 18, 1978

[54] GAIN CONTROL CIRCUIT

[75] Inventors: Shigeru Okada; Takao Arai, both of Yokohama; Kouichi Tomatsuri; Hiroshi Toeda, both of Katsuta, all of Japan

[73] Assignee: Hitachi, Ltd., Japan

[21] Appl. No.: 829,244

[22] Filed: Aug. 30, 1977

[30] Foreign Application Priority Data

Sep. 3, 1976 [JP] Japan .............................. 51-104836

[51] Int. Cl.$^2$ ............................................. H03G 3/30
[52] U.S. Cl. .................................... 330/254; 330/279; 330/285; 330/289
[58] Field of Search ............... 330/136, 254, 279, 285, 330/289; 358/27

[56] References Cited
U.S. PATENT DOCUMENTS
3,940,708  2/1976  Sumi et al. ........................... 330/254

Primary Examiner—James B. Mullins
Attorney, Agent, or Firm—Craig & Antonelli

[57] ABSTRACT

Disclosed is a gain control circuit which comprises a gain control section including as its essential component a differential amplifier with which diodes or transistors arranged to act as diodes are connected as a load, and a control signal section including a logarithmic compression circuit and an exponential expansion circuit and providing a control signal for control of the gain of the gain control section. A temperature compensation circuit having a temperature dependence cancelling both the temperature dependence of the gain control section and that of the control signal section is provided in the bias circuit for the transistor in the last stage of the control signal section, so that the desired temperature compensation for the entire gain control circuit can be achieved at a single point.

3 Claims, 2 Drawing Figures

GAIN CONTROL CIRCUIT

LIST OF PRIOR ART REFERENCES (37 CFR 1.56 (a))

The following references are cited to show the state of the art:

(1) Walter G. Jung, "Get gain control of 80 to 100 dB" in ELECTRONIC DESIGN 13, pp94 – 99 (June 21, 1974)

(2) Japanese Patent Laid-Open No. 40729/74, Minaguchi, Apr. 16, 1974

FIELD OF THE INVENTION

The present invention relates to a gain control circuit in which the gain of its gain control section is controlled by a control signal obtained by level compression and expansion, and more particularly to a temperature compensation device for such a gain control circuit.

DESCRIPTION OF THE PRIOR ART

Figure 1:
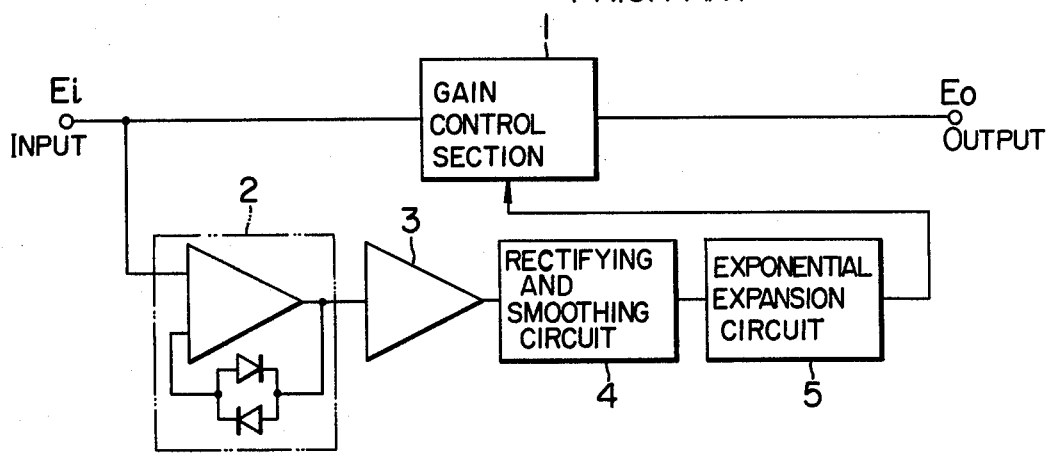
FIG. 1 is a block diagram of a conventional gain control circuit.

Referring to FIG. 1 showing a conventional gain control circuit in block diagram fashion, it comprises a gain control section 1 including as its essential component a differential amplifier with which diodes or transistors arranged to act as diodes are connected as a load, a logarithmic compression circuit 2 including logarithmic conversion diodes, an amplifier 3, a full-wave rectifying and smoothing circuit 4, and an exponential expansion circuit 5. In FIG. 1, the parts 2 to 5 constitute a control signal section providing the control signal applied to the gain control section 1. In operation, an input signal $E_i$ is applied to the gain control section 1, and at the same time, to the logarithmic compression circuit 2. The output of the logarithmic compression circuit 2 is applied to the full-wave rectifying and smoothing circuit 4 after being amplified to a required level by the amplifier 3. The full-wave rectifying and smoothing circuit 4 consists of a full-wave rectifying circuit and a voltage-holding time-constant circuit and acts to convert the logarithmically compressed input signal into a DC signal of the same level. The DC output signal of the full-wave rectifying and smoothing circuit 4 is applied to the exponential expansion circuit 5 to be subjected to exponential expansion, and the output of the exponential expansion circuit 5 is applied to the gain control section 1 as the level control signal. Consequently, the input signal $E_i$ having been subjected to the level compression and expansion appears as an output signal $E_o$. The gain control by the gain control section 1 utilizes the fact that the small signal parameter of the diodes varies relative to current. However, due to the fact that this parameter is a function of temperature, the output level varies in dependence upon the ambient temperature. In the logarithmic compression circuit 2 of the control signal section too, the voltage-current characteristic of the diodes is also utilized, and thus, the output of this circuit 2 varies also in dependence upon the ambient temperature. Therefore, the level of the control signal varies tending to vary the output level of the gain control circuit. This tendency should be remedied by carrying out required temperature compensation.

Heretofore, the required temperature compensation has been carried out in the individual sections of the gain control circuit. More precisely, common practice has been such that the amplifier in the gain control section 1 is designed to have a temperature-dependent gain in order to achieve the required temperature compensation for the gain control section 1, and the amplifier 3 disposed in the succeeding stage of the logarithmic compression circuit 2 is designed to have a temperature-dependent gain in order to achieve the required temperature compensation for the temperature-dependent variation of the output of this circuit 2. However, such a prior art practice has been defective in that the temperature compensation must be carried out at a plurality of points, resulting in difficulty of attaining appropriate temperature compensation, and expensive elements are required for the desired temperature compensation.

SUMMARY OF THE INVENTION

It is a primary object of the present invention to provide an improved gain control circuit in which the desired temperature compensation for the gain control section and its control signal section can be simply and easily achieved and which is suitable to be put into practical use.

Utilizing the basic operation of controlling the gain of the gain control section by the control signal level, the improved gain control circuit according to the present invention employs a control signal having a temperature dependence opposite to that of the gain control section thereby achieving the desired temperature compensation for the gain control section while at the same time achieving temperature compensation for the control signal section. Thus, the required temperature compensation for the entire gain control circuit can be simply and easily done.

DETAILED DESCRIPTION OF THE PREFERRED EMBODIMENT

Figure 2:
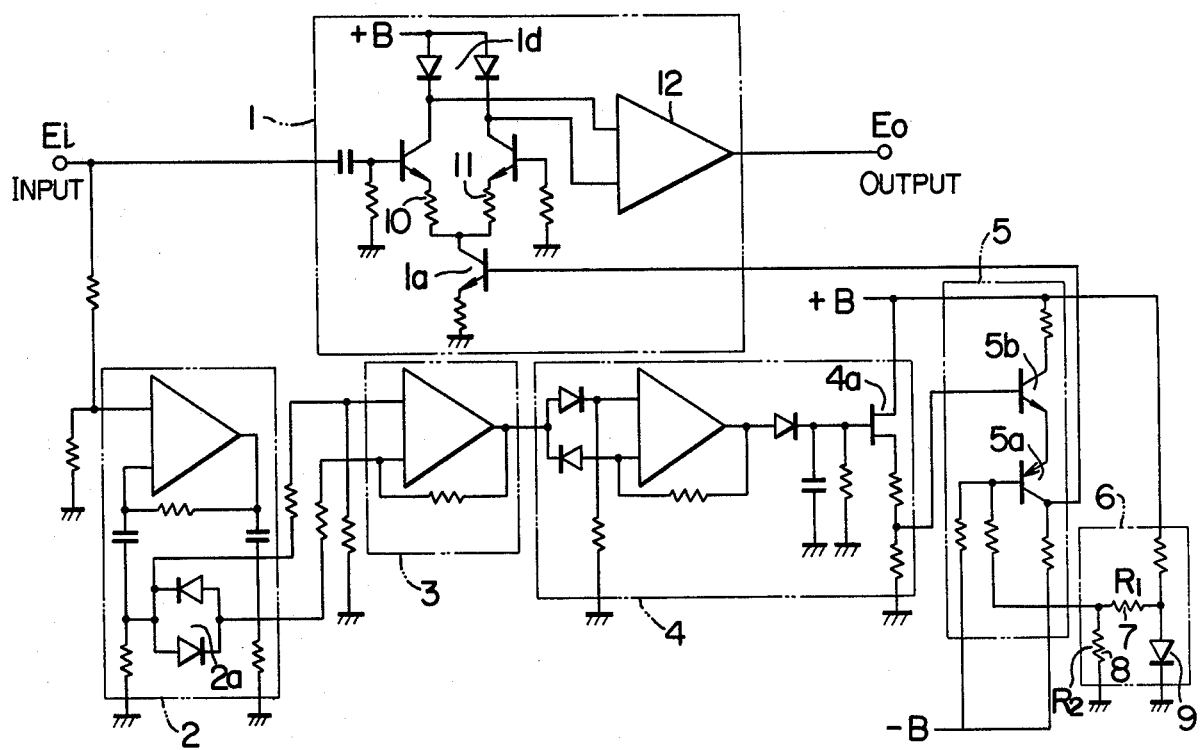
FIG. 2 is a circuit diagram of a preferred embodiment of the gain control circuit of the present invention which includes temperature compensating means.

Referring to FIG. 2 showing an improved gain control circuit according to the present invention, the blocks 1 to 5 show the detailed structures of the corresponding ones in FIG. 1. The exponential expansion circuit 5 includes a pair of differentially operating transistors 5a and 5b as its essential parts. The output of the full-wave rectifying and smoothing circuit 4 is applied to the base of transistors 5b, and a temperature compensation circuit 6 consisting of resistors 7, 8 and a plurality of series-connected diodes 9 is connected to the base of transistor 5a. The control signal appearing at the collector of transistor 5a is applied to the base of transistor 1a in the gain control section 1.

Suppose now that the small signal parameter of the diodes 1d in the gain control section 1 is $r_d$, and the gain of a differential amplifier 12 is unity. Then, the following equation (1) holds:

$$\frac{E_o}{E_i} = \frac{kT}{R_e qI} \quad (1)$$

where $E_i$ is the input signal, $E_o$ is the output signal, $k$ is the Boltzmann's constant, T is the absolute temperature, $R_e$ is the resistance value of resistors 10 and 11, $q$ is the charge of an electron, and I is the control current flowing through the diodes 1d. It will be seen from the equation (1) that the gain varies in proportion to the absolute temperature T. In order that the gain control section 1 is not dependent on the temperature, therefore, the control current I flowing through the diodes 1d should have such a temperature dependence which satisfies the following equation (2):

$$\frac{K(T + \Delta T)}{R_e q(I + \Delta I)} = \frac{kT}{R_e qI} \text{ or } \frac{\Delta T}{T} = \frac{\Delta I}{I} \quad (2)$$

where $\Delta T$ is a minute variation in the absolute temperature T, and $\Delta I$ is a minute variation in the control current I. Since the control current is proportional to the control signal, the equation (2) can be satisfied when the control signal has a suitable temperature dependence. Suppose that the temperature dependence of the control signal satisfying the equation (2) is $a$ volts/° C, and the gain of the differential amplifier in the exponential expansion circuit 5 in the control signal section is $G_1$. Then, the temperature dependence of the gain control section 1 can be compensated when the temperature dependence of the bias voltage for the PNP transistor 5a in the exponential expansion circuit 5 is selected to be $-a/G_1$ volts/° C.

Suppose then that the temperature dependence of the forward voltage $V_F$ for the diodes 2a in the logarithmic compression circuit 2 is $b$ volts/° C, the gain of the amplifier 3 is $G_2$, and the dividing ratio of the source voltage for the FET 4a in the full-wave rectifying and smoothing circuit 4 is 1/F. Then, the temperature dependence of the input voltage of the exponential expansion circuit 5 in the control signal section is $(b \times G_2)/F$ volts/° C. Therefore, when the base bias voltage for the transistor 5a constituting the differential amplifier together with the transistor 5b in the exponential expansion circuit 5 is selected to have a temperature dependence of $(b \times G_2)/F$ volts/° C, the temperature dependence of the logarithmic compression circuit 2 can be easily compensated as when it is compensated by the amplifier 3 connected in its succeeding stage. It will thus be readily understood that the desired temperature compensation for the entire gain control circuit can be achieved when the temperature dependence of the base bias voltage for the transistor 5a in the exponential expansion circuit 5 is selected to have the following value:

$$\left[ \frac{-a}{G_1} + \frac{(b \times G_2)}{F} \right] \text{volts/° C} \quad (3)$$

Thus, the temperature dependence of the entire gain control circuit can be simply and easily compensated when the resistance values $R_1$ and $R_2$ of the respective resistors 7 and 8 and the number $n$ of the series-connected diodes 9 are selected to satisfy the following equation (4):

$$\frac{-a}{G_1} + \frac{(b \times G_2)}{F} = \frac{R_2}{R_1 + R_2} \times nb \quad (4)$$

That is, these values are selected to satisfy the following relation:

$$\frac{n \cdot R_2}{R_1 + R_2} = \frac{-a}{b \cdot G_1} + \frac{G_2}{F}$$

It will be understood from the foregoing description of the present invention that the desired temperature compensation for the entire gain control circuit including the gain control section and its control signal section can be simply and easily achieved, and the gain control circuit can be satisfactorily put into practical use.

We claim:
1. A gain control circuit comprising:
a gain control section including at least a differential amplifier with which diodes or transistors arranged to act as diodes are connected as a load and the gain of which is controlled by a control signal;
a control signal section including at least a logarithmic compression circuit and an exponential expansion circuit for the logarithmic compression and exponential expansion of an input signal applied to said differential amplifier, said control signal section applying its output signal to a control terminal of said gain control section as said control signal; and
a temperature compensation circuit connected to a bias terminal of a transistor in the last stage of said control signal section to provide a temperature-dependent bias voltage which cancels the temperature dependence of said control signal section and that of said gain control section.

2. A gain control circuit as claimed in claim 1, wherein said exponential expansion circuit constitutes the last stage of said control signal section and includes a pair of differentially operating transistors, and an input signal related to the output of said logarithmic compression circuit is applied to the base of the first transistor, said temperature compensation circuit being connected to the base of the second transistor whose collector provides the output terminal for said control signal.

3. A gain control circuit comprising:
a gain control section including at least a differential amplifier with which diodes or transistors arranged to act as diodes are connected as a load and the gain of which is controlled by a control signal;
a logarithmic compression circuit including logarithmic conversion diodes for the logarithmic compression of an input signal applied to said differential amplifier;
an amplifier amplifying the output of said logarithmic compression circuit;
a full-wave rectifying and smoothing circuit converting the output of said amplifier into a DC signal;
an exponential expansion circuit including a pair of differentially operating transistors arranged to receive the DC output of said full-wave rectifying and smoothing circuit at the base of the first transistor and to apply said control signal from the collector of the second transistor; and
a temperature compensation circuit connected to the base of said second transistor in said exponential expansion circuit to provide a temperature-dependent bias voltage which cancels the temperature dependence of said logarithmic compression circuit and that of said gain control section.

* * * * *